United States Patent
Bolz et al.

(10) Patent No.: US 7,151,328 B2
(45) Date of Patent: Dec. 19, 2006

(54) AUXILIARY POWER SOURCE AND METHOD FOR OPERATING THE AUXILIARY POWER SOURCE, AS WELL AS CIRCUIT ARRANGEMENT FOR SWITCHING A LOAD

(75) Inventors: Steven Bolz, Pfatter (DE); Günter Lugert, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 396 days.

(21) Appl. No.: 10/454,169

(22) Filed: Jun. 4, 2003

(65) Prior Publication Data

US 2004/0189096 A1 Sep. 30, 2004

(30) Foreign Application Priority Data

Mar. 24, 2003 (DE) ................. 103 13 027

(51) Int. Cl.
*H02J 1/00* (2006.01)
*G05F 1/10* (2006.01)
*H02M 3/18* (2006.01)

(52) U.S. Cl. .................. 307/43; 323/222; 363/59; 363/60

(58) Field of Classification Search ............... 307/43; 323/222; 363/59, 60

See application file for complete search history.

(56) References Cited

U.S. PATENT DOCUMENTS

| 4,284,051 A | * | 8/1981 | Maisch ................. 123/490 |
| 4,733,159 A | * | 3/1988 | Edwards et al. ........... 323/282 |
| RE35,041 E | | 9/1995 | Rossi et al. ............... 327/109 |
| 5,635,772 A | * | 6/1997 | Lagree et al. ............ 307/64 |
| 2004/0036418 A1 | * | 2/2004 | Rooke et al. ............. 315/77 |

FOREIGN PATENT DOCUMENTS

| EP | 0 351 898 A2 | 1/1990 |
| JP | 06133539 | 5/1994 |
| JP | 10191625 | 7/1998 |
| WO | 03/065542 | 8/2003 |

* cited by examiner

*Primary Examiner*—Brian Sircus
*Assistant Examiner*—Dru Parries
(74) *Attorney, Agent, or Firm*—Baker Botts L.L.P.

(57) ABSTRACT

An auxiliary power source (HQ) constructed with conventional components for generating an auxiliary voltage lying above the voltage of a power supply source (U1), in particular for triggering an n-channel MOS transistor (T11) used as a high-side switch for switching a load (I1). An energy store (L1) is connected via a switching element (T1) to the power supply source (U1) and an auxiliary voltage is generated at a power output (U3).

8 Claims, 3 Drawing Sheets

AUXILIARY POWER SOURCE AND METHOD FOR OPERATING THE AUXILIARY POWER SOURCE, AS WELL AS CIRCUIT ARRANGEMENT FOR SWITCHING A LOAD

PRIORITY

This application claims foreign priority of the German application DE 10313027.6 filed on Mar. 24, 2003.

TECHNICAL FILED OF THE INVENTION

The invention relates to a power source and a method for operating the auxiliary power source, as well as a circuit arrangement for switching a load, in particular through a high-side switch with an N-channel MOS transistor.

BACKGROUND OF THE INVENTION

In unpublished Patent Application DE 10252827 a circuit arrangement for rapid activation of loads was proposed in which the load can be connected to a power supply source by means of a switching transistor designed as an N-channel MOS power transistor and switched as a high-side switch. Here an auxiliary voltage which exceeds the voltage of the power supply source is applied to the gate electrode of the switching transistor by a controllable switching device.

SUMMARY OF THE INVENTION

The object of invention is to create an auxiliary power source and a method for operating the auxiliary power source, as well as a circuit arrangement for switching a load which stands out by virtue of its simple structure and a high level of electromagnetic compatibility (EMC).

The invention implements this task by means of an auxiliary power source to provide an auxiliary voltage, especially a gate voltage for an N-channel transistor, that can be connected to a power supply source that provides a power supply, whereby the auxiliary voltage is greater than the supply voltage, comprising an energy store that can be connected via a switching element with the power supply source, and a monitoring unit which monitors a variable dependent on the current through the energy store and activates the switching element depending on this variable.

The switching element can switch on and/or off when the current through the energy store rises above or falls below a specified threshold value. The switching element may switch when the current through the energy store is zero. The energy store can be an inductor. The monitoring unit can monitor the current through the switching element. The switching element can be a field effect transistor. The monitoring unit can be coupled with a second power supply source wherein the second supply voltage of the second power supply is below the supply voltage. The auxiliary voltage may exceed the supply voltage by 12 Volts.

A Method for operating an auxiliary power source, comprising the steps of:
generating an auxiliary voltage by the auxiliary power source which lies above a supply voltage of a power supply source, and
connecting an energy store via a switching element with a power supply source, whereby the switching element is controlled by a monitoring unit depending on a current through the energy store.

The current through the energy store can be reduced as soon as the auxiliary voltage has reached a specified threshold value. The current through the energy store can be limited to a prespecified maximum value. The switching element can be switched by the monitoring unit if no current is flowing through the energy store. The time at which the switching element is switched back on can be determined by the voltage drop across the energy store.

A circuit arrangement for switching a load, with an auxiliary power source comprising an energy store that can be connected via a switching element with a power supply source, and a monitoring unit which monitors a variable dependent on the current through the energy store and activates the switching element depending on this variable, comprises a switching unit which connects a switch depending on a signal present at a control input with a power output of the auxiliary power source, whereby the load is supplied with energy.

The switch can be designed as an n-channel MOS power transistor which is used as a high-side switch. The load can be an inductive load and may in particular be an electromagnetic control unit for an injection valve of an internal combustion engine.

An auxiliary power source in accordance with the invention features an energy store which can be connected via a switching element to a power supply source which provides a supply voltage. The auxiliary power source delivers an auxiliary voltage that is greater than the supply voltage.

A monitoring unit monitors a variable that depends on the current through the energy store and controls the switching element depending on this variable.

An outstanding feature of the auxiliary power source illustrated here is its simple construction from standard electrical components. In contrast to known auxiliary power sources there is no need to use special integrated switched mode regulators and transformers.

The circuit arrangement is a highly efficient design which means that dissipated heat radiated from the circuit arrangement will be reduced.

In a preferred embodiment of the auxiliary power source the switching element is switched on and/or switched off in a no-load state, in which case both the losses arising at the switching element as well as the EMC faults of the auxiliary power source will be reduced.

The circuit arrangement in accordance with the invention for switching a load enables simple control of the load, in which case the circuit arrangement is made up of standard components, dispenses with a transformer and is a highly efficient design.

In a variant the switching element is switched on and/or off if the current through the energy store exceeds or falls below a prespecified threshold value.

The switching element is preferably switched when the current through the energy store is zero. The advantage of this is that switching signal edges of the switching element are simple to control and peak reverse recovery currents through the auxiliary power source will be avoided.

BRIEF DESCRIPTION OF THE DRAWINGS

A number of exemplary embodiments of invention will now be explained in greater detail on the basis of schematic diagrams. The diagrams show.

DETAILED DESCRIPTION OF THE PREFERRED EMBODIMENT

Figure 1:
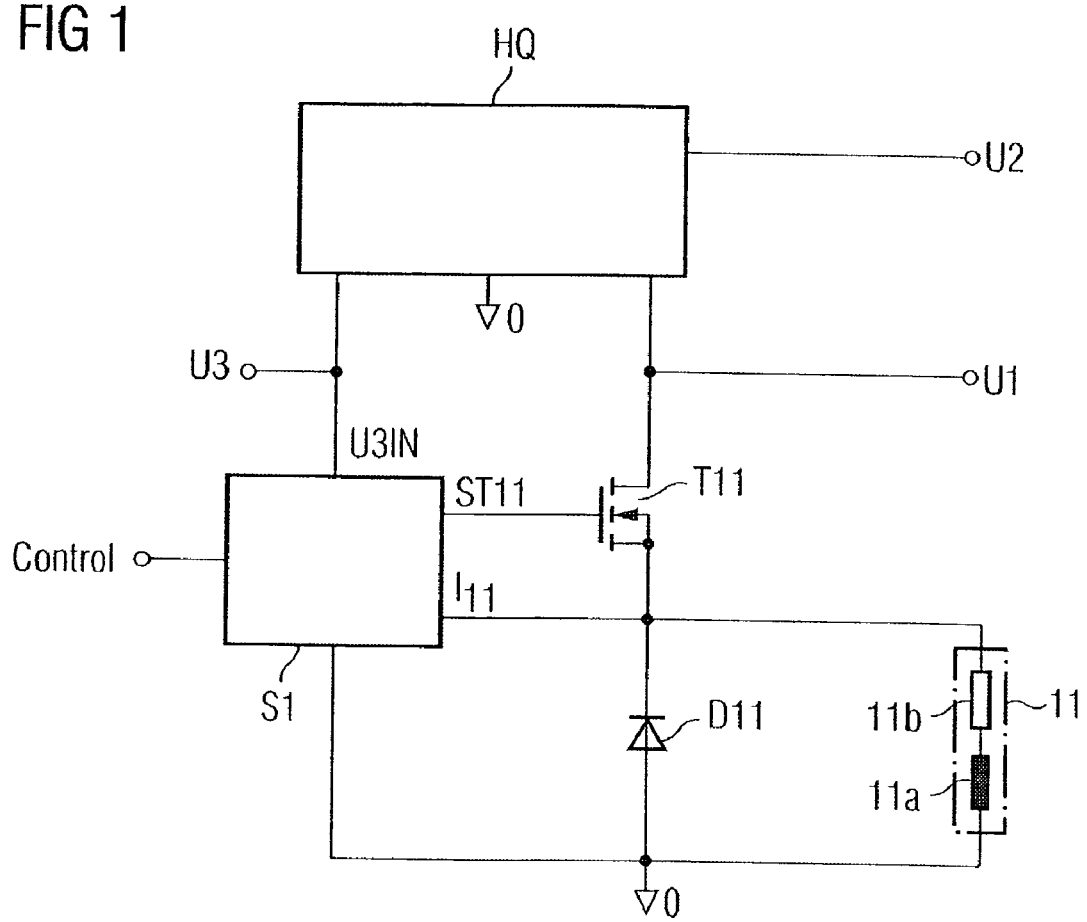
FIG. 1 a block diagram of a circuit arrangement in accordance with the invention for switching a load, FIG. 2 an exemplary embodiment of an auxiliary power source, in accordance with the invention FIG. 3a the timing of the coil current IL1 of the exemplary embodiment shown in FIG. 2, FIG. 3b the timing of current UT1D at the drain-terminal of transistor T1, FIG. 3c the timing of voltage UR1 via the resistor R1, and FIG. 3d the timing of voltage at the base of transistor T3.

FIG. 1 shows a circuit arrangement for switching a load 11 which can be connected via a switching element T11 to a power supply source U1. The circuit arrangement further features an auxiliary power source HQ, a switching unit S1 and a diode D11.

The load 11 can be connected via a switching element T11, here an N-channel MOS transistor designed as a high side switch, with a first power supply source U1. The first power supply source U1 here features a voltage of 48 volts for example.

The auxiliary power source HQ makes available at its auxiliary power output an auxiliary voltage which is greater than the voltage of the first power source U1, by 12 V for example.

Further the auxiliary power source HQ is electrically connected to ground and to a second power supply source U2.

Switching unit S1 features and number of inputs: A control input "Control", an auxiliary voltage input U3IN which is connected to power output U3 of the auxiliary power source, and a monitoring unit I11. Switching unit S1 further features a control output ST11 which is electrically connected to the control terminal of switching element T11.

If the "Control" input is activated by an external unit not shown the auxiliary voltage is switched through to the gate of transistor T11 and connects load 11 with power source U1, whereby load 11 is supplied with energy.

Since the gate of transistor T11 is activated with a voltage above the supply voltage of the first power source U1, an n-channel transistor can also be used here.

Load 11 can be an inductive load, for example an electromagnetic control unit, in particular an injection valve of an internal combustion engine. The inductive load 11 shown here can be described by a series circuit comprising the actual coil inductivity 11a, for example 150 µH of the electromagnet and the winding resistance 11b, for example 0.5 Ohms.

Diode D11 has the task of allowing a current flow to discharge the coil inductivity 11a after transistor T11 has switched off.

Figure 2:
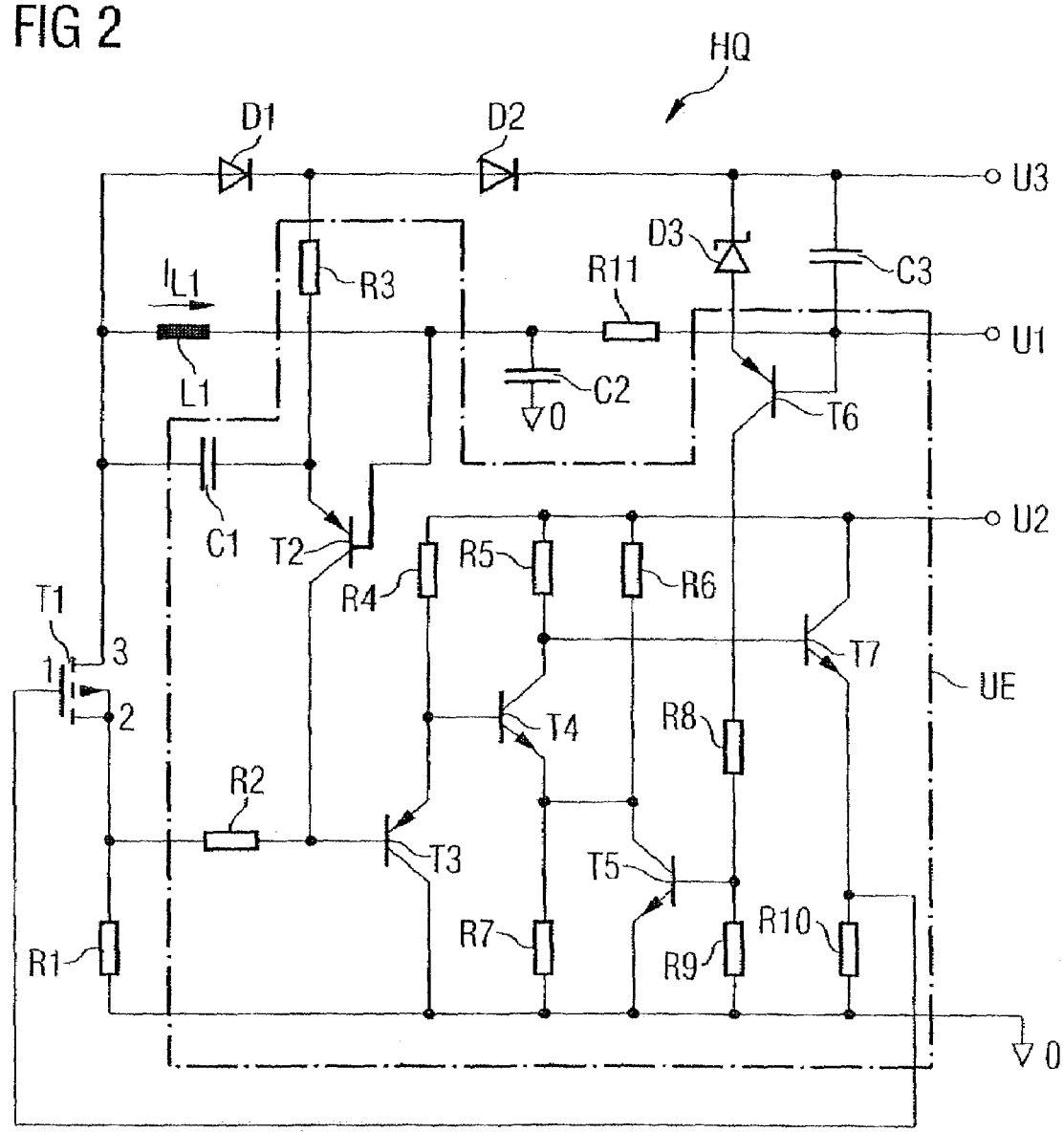

FIG. 2 shows an exemplary embodiment of an auxiliary power source HQ in accordance with the invention.

Between the drain terminal of a transistor T1, here a p-channel MOSFET for example, and the first power source U1 is an energy store, an inductor L1 in this case. To prevent the alternating component of current IL1 flowing through coil L1 flowing in power supply source U1, a low pass filter consisting of a capacitor C2 and a resistor R11 is located here.

The source terminal of transistor T1 is connected via a resistor R1 to ground. The drain terminal of transistor T1 is further connected via a first diode D1 and a second diode D2 to a power output U3 of the auxiliary power source HQ. Diodes D1 and D2 are switched in such a way here that their direction of flow is directed from transistor T1 to power output U3.

Auxiliary power source HQ further features a monitoring device UE which switches transistor T1 on or off depending on current IL1 through coil L1. Monitoring unit UE monitors a parameter that depends on current IL1 through coil L1, for example the drop in voltage UR1 via resistor R1 and activates transistor T1.

Monitoring unit UE features a second transistor T2 here, preferably a pnp transistor, of which the base is connected to the first terminal of coil L1 related to the power supply source U1 and of which the emitter is connected via a capacitor C1 with the other terminal of coil L1. The collector of transistor T2 is connected via a resistor R2 to the source terminal of transistor T1.

Furthermore the monitoring unit features a third transistor T3, also preferably a pnp-transistor, the base of which is connected to the collector of transistor T2. The emitter terminal of transistor T3 is electrically connected via a resistor R4 to the second power source U2—here with a rated voltage of 5 volts—. The collector terminal of transistor T3 is connected to ground.

A fourth transistor T4, here an npn transistor, is connected by its base terminal to the emitter terminal of transistor T3. The collector terminal of transistor T4 is also connected via a resistor R5 with the second power supply source U2. The emitter terminal of transistor T4 is connected via a resistor R7 to ground.

A fifth transistor T5, here preferably an npn transistor, is connected by its collector terminal to the emitter terminal of transistor T4 and via a resistor R6 to the second power supply source U2. The emitter terminal of transistor T5 is connected to ground. The terminal of transistor T5 is on the one hand connected via resistor R9 to ground and on the other hand by resistor R8 to the collector terminal of a sixth transistor T6. The emitter terminal of transistor T6 is connected to the cathode terminal of a Zener diode D3, which in its turn is connected by its anode terminal to power output U3 of the auxiliary power source. The base terminal of transistor T6 is connected to a first power supply source U1. A capacitor C3 is connected on one hand with voltage output U3 and on the other hand to the first power supply source U1.

Monitoring unit UE further features a transistor T7, here an npn transistor, which is connected by its base to the collector terminal of transistor T4 and by its collector terminal to the second power supply source U2. The emitter terminal of transistor T7 is on one hand connected directly to the gate terminal of transistor T1 and on the other hand is connected via a resistor R10 to ground.

When the circuit arrangement is activated there is no current passing through coil L1 and transistor T1 is switched off. No current is thus flowing through transistor T1 and coil L1 and the voltage at resistor R1 is 0 volts.

The resistors R6 and R7 form a voltage divider. At resistor R6, because of the voltage of the second power supply U2, here 5 volts, there is a voltage drop of +250 millivolts.

Because of the connection to the source terminal of transistor T1 via resistor R2 there is a voltage of 0 volts at the base of transistor T3. The base voltage of transistor T4, determined here by the voltage drop at the base emitter diode of the transistor T3 is 700 millivolts.

Because of the difference between the base voltage of transistor T4 of 700 millivolts and the voltage drop of 250 millivolts at resistor R6 of voltage divider the base-emitter voltage of transistor T4 is 450 millivolts here. Transistor T4 is thus switched off.

The base terminal of transistor T7 is driven with a voltage of 5 volts via resistor R5. The emitter voltage of transistor T7 now amounts to 4.3 volts. Since this voltage is also present at the gate terminal of transistor T1 the latter is activated.

Thus the first power supply source U1—here 48 volts—is now connected to ground via coil L1, the conducting transistor T1 and the resistor R1. Coil L1 thus begins to charge up. The increasing charge current IL1 through the coil L1 also flows through transistor T1 and creates a voltage drop UR1 via resistor R1. This voltage UR1 is proportional to current IL1. In the exemplary embodiment described here resistor R1 has a value of 10 Ohms so that for a current flow of 25 milliamperes at resistor R1 there is a voltage drop UR1 of 250 millivolts.

Because of this voltage drop UR1 the base voltage of transistor T3 then also amounts to +250 millivolts. The base-emitter voltage of transistor T4 now amounts to 700 millivolts, since the voltages of +250 millivolts and −250 millivolts compensate for each other here. Transistor T4 then activates with the result that the voltage the collector terminal of transistor T4 drops to a voltage <1 volt. This also causes the base voltage of transistor T7 to drop and in consequence its emitter voltage to a value of 0.3 volts. The result of this is now that the gate voltage of transistor T1 sinks below its threshold voltage and transistor T1 switches off.

The switch-off time of T1 is determined in this case by the discharge of the feedback capacitance (Crss) of transistor T1 and the current through resistor R10.

To prevent a renewed switch-on of transistor T1 by a switch-off of transistor T4, the potential of the base of transistor T3 is increased by the voltages created at resistors R2 and R4 by the collector current of transistor T2 which prevents transistor T4 switching off.

As soon as transistor T1 switches off, the voltage at coil L1—driven by the induced electromotive force of the inductivity—whereby capacitor C1 is discharged and the charge current flows through the emitter of transistor T2 and generates a positive voltage drop at resistor R2. This means that transistor T4 remains switched on during the rising voltage edge of voltage UL1 via coil L1.

When the voltage at coil L1 has risen far enough, a current flows via diodes D1 and D2 into energy storage capacitor C3. This energy storage capacitor C3 buffers the auxiliary voltage at power output U3. Coil L1 subsequently begins to discharge. Through this transport of charge the voltage increases at capacitor C3 and thus the voltage at power output U3 as well.

At the same time the voltage at resistor R3 is raised to a value above the supply voltage of 48 volts, whereby a current flows through resistor R3 and transistor T2 driven in the base circuit. This current in its turn creates a voltage drop at resistors R2 and R1 which in their turn keep transistor T4 switched on. This state exists until coil L1 is completely discharged and the voltage at coil L1 collapses. As a consequence the current flow through resistor R3, transistor T2 and resistors R2 and R1 also collapses, whereon transistor T4 switches off. The collector voltage of transistor T4 now increases again, whereon transistor T1 is switched back on by transistor T7 and a new charge cycle of coil L1 begins.

The switch-on procedure of transistor T1 occurs under no-load conditions since at this point coil L1 is completely discharged and thus no current IL1 is flowing. The charging and discharging of coil L1 is controlled depending on current IL1 by coil L1. This process runs independently and periodically for as long as power supply sources U1 and U2 are switched on.

Figure 3A:
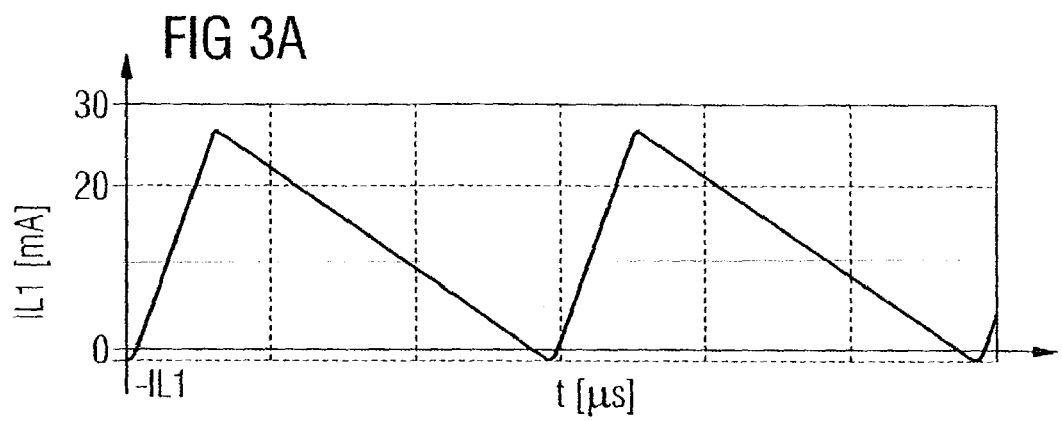
Figure 3B:
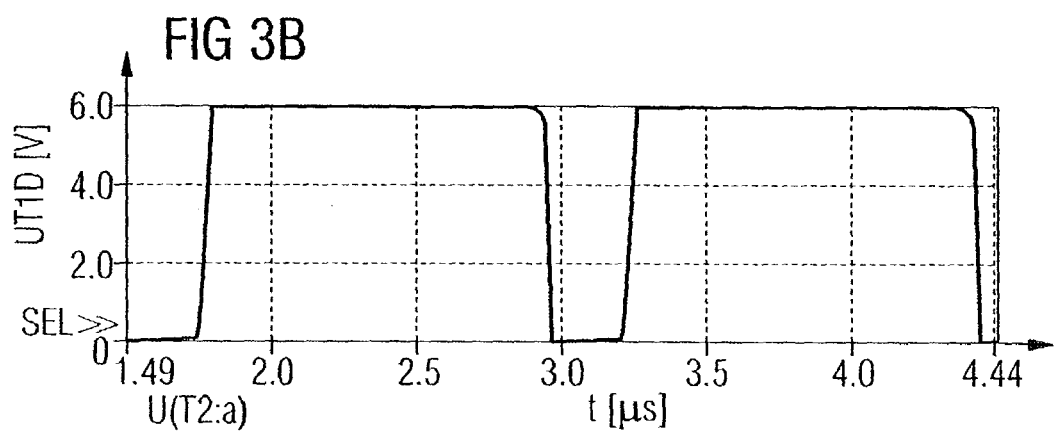

FIG. 3a shows the graph of current IL1 flowing through coil L1 depending on time t. The auxiliary power source HQ represents a self-clocking switched-mode regulator which creates a delta current IL1 through coil L1. FIG. 3b shows the timing of voltage UT1D at the drain terminal of transistor T1.

The circuit arrangement has the advantage here that transistor T1, as already mentioned, switches on precisely when current IL1 is zero. This brings further positive effects, one being that at the moment of switch-on no current flows through diodes D1 and D2. This also means that no feedback current peaks,—basically caused by the blocking delay time of current carrying diodes—occur. If transistor T1 switches on when diodes D1 and D2 are still conducting, a current flows out of capacitor C3 through diodes D1 and D2, transistor T1 and resistor R1 to ground. This current flow can result in a destruction of an electronic component in the path carrying the return current.

Another benefit is that the switching on of transistor T1 at the point of complete discharge of coil L1 prevents oscillations occurring at coil L1. If coil L1 were not supplied with a charge current again until a later time, an oscillating circuit consisting of the winding capacitance of coil L1 and the inductivity of coil L1 would begin to oscillate.

In this way, with the circuit arrangement in accordance with the invention, peak reverse recovery currents and oscillations which could lead to EMC faults at other electrical and electronic components would be avoided at coil L1. The delta input current, the simple-to-control switching edges of transistor T1 and the return peak reverse recovery currents thus prevented have a positive effect on the EMC fault behavior here.

Figure 3C:
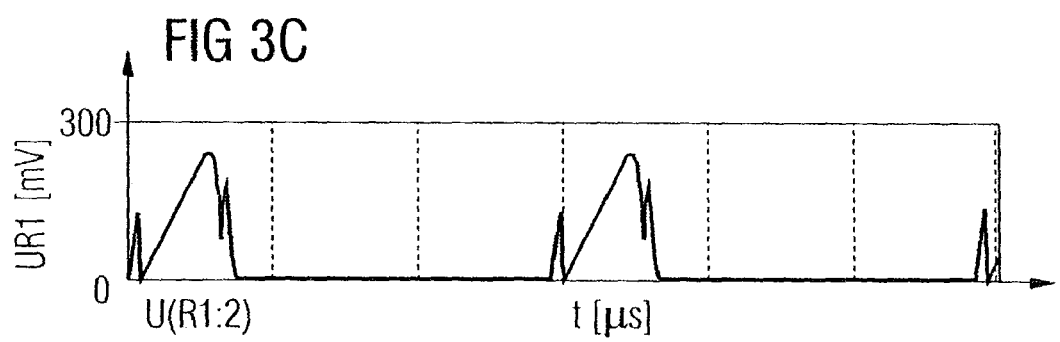

FIG. 3c shows the curve for voltage UR1, which drops off at resistor R1 because of current IL1. This voltage UR1 follows the rise of current IL1 up to a peak value and then drops off rapidly. The voltage peaks at the start of the charge phase is derived from the charging up of the gate capacitor of transistor T1. The voltage peak at the beginning of the discharge phase is caused by a discharging of capacitor C1.

Figure 3D:
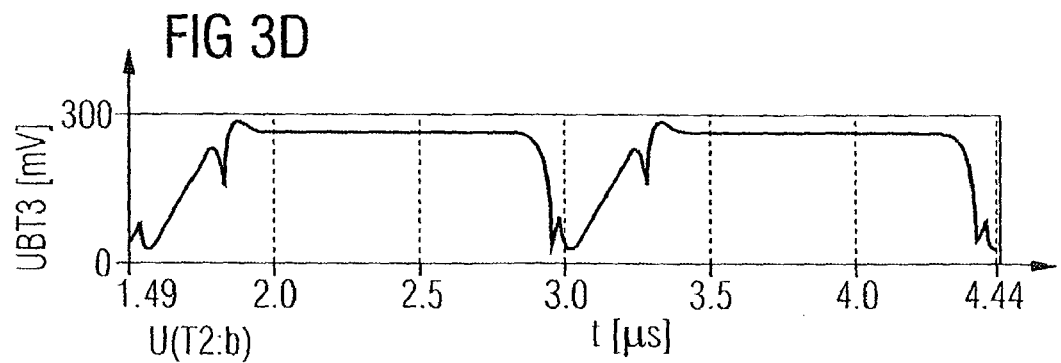

FIG. 3d shows the curve of base voltage UBT3 of transistor T3. The potential of the base of transistor T3—while transistor T1 is switched off—is greater than a reference voltage of 250 millivolts. This is caused, as already mentioned above, by the flow of current through transistor T2 and the associated voltage drop at the resistors R2 and R1. Transistor T4 thus remains switched off.

While coil L1 discharges the voltage at capacitor C3 slowly increases. Thus the voltage also increases at output U3. If the auxiliary voltage reaches the order of magnitude of operating voltage UZ of Zener diode D3 and the base emitter flow voltage of transistor T6, transistor T6 begins to conduct and a current flows through Zener diode 3, transistor T6 and through resistors R8 and R9 to ground. If the voltage at R9 exceeds roughly 700 millivolts, transistor T5 begins to conduct. The result of this is that the voltage at the node point—collector terminal of transistor T5—between resistors R6 and R7 drops. This voltage via resistor R7 serves as a reference value for the charge process of coil L1. If the prespecified reference value is reached here transistor T1 is switched off, as already described.

In this way, if the voltage UL1 across coil L1 is large enough to cause a flow of current through Zener diode D3 and the resistor R6, the charge current of coil L1 is reduced. Then charge current IL1 through coil L1 will be reduced to such an extent that only a current IL1 is flowing that is just sufficient to operate the control loop consisting of Zener diode D3, transistor T6 and resistors R8 and R9.

The result of an increase in the outflow of current at output U3 is that, by means of the regulation of the reference voltage described above—the voltage across resistor R7—increases and thus charge current IL1 of the coil L1 is increased. Thus, what is involved here is a voltage-controlled current regulation.

The switching frequency of transistor T1 is regulated depending on the final value of charge current IL1, since for a smaller final value of charge current IL1 the charging and discharging of coil L1 needs a shorter time. By contrast to the switching frequency however the speed of rise of the charge current dIL1/dt remains constant. This brings enormous benefits for the design of a filter to counter EMC faults since the filter must thus only be tuned to the faults caused by this rise. The switching losses of transistor T1 remain roughly constant despite a growing switching frequency because of the decreasing switch-off current. The reference voltage determined by Zener diode D3 and transistor T6 also limits the charge current IL1 to a maximum value. In this way the current IL1 is limited without delays.

A further benefit of the circuit arrangement in accordance with the invention is that the current is also limited when the switched-mode regulator is switched on and no current peaks therefore occur at switch-on. This means that the circuit allows what is known as a soft start.

Alternatively the anode terminal of diode D2 can be connected to the anode terminal of diode D1 rather than to its cathode terminal. Diode D2 is then connected on one side directly with coil L1 and on the other side with power output U3.

This circuit variant has the advantage with higher charge currents IL1 that a voltage only drops off via one diode, here diode D1, so that the line losses are halved.

As an alternative to the exemplary embodiment shown here operation of the auxiliary power source between a negative reference potential and ground or between two different potentials is conceivable. The transistors and the conducting direction of the diodes would have to be adapted accordingly.

We claim:

1. Auxiliary power source to provide an auxiliary voltage being greater than a supply voltage, comprising:
   a separate, distinct capacitor connected to a first terminal for providing the auxiliary voltage and to a second terminal for receiving the supply voltage,
   an inductance that can be connected via a switching element with a power supply source, the inductance being coupled via at least one diode with the capacitor, and
   a monitoring unit which monitors a variable dependent on the current through the inductance and activates the switching element depending on this variable, wherein the switching element is controlled in such a way that the voltage at the first terminal is higher than the supply voltage.

2. Auxiliary power source according to claim 1, wherein the switching element switches on and/or off when the current through the energy store rises above or falls below a specified threshold value.

3. Auxiliary power source according to claim 2, wherein the switching element switches when the current through the energy store is zero.

4. Auxiliary power source according to claim 1, wherein the monitoring unit monitors the current through the switching element.

5. Auxiliary power source according to claim 4, wherein the switching element is a field effect transistor.

6. Auxiliary power source according to claim 1, wherein the monitoring unit is coupled with a second power supply source wherein the second supply voltage of the second power supply is below the supply voltage.

7. Auxiliary power source according to claim 1, wherein the auxiliary voltage exceeds the supply voltage by 12 Volts.

8. Auxiliary power source to provide an auxiliary voltage being greater than a supply voltage, comprising:
   a separate, distinct connected to a first terminal for providing the auxiliary voltage and to a second terminal for receiving the supply voltage,
   an inductance that can be connected via a switching element with a power supply source, the inductance being coupled via at least one diode with the capacitor, and
   a monitoring unit which monitors a variable dependent on the current through the energy store and activates the switching element depending on this variable, wherein the switching element is controlled in such a way that the voltage at the first terminal is higher than the supply voltage, wherein the switching element switches on when the current through the energy store is zero and off when the current through the energy store rises above or falls below a specified threshold value.

* * * * *

UNITED STATES PATENT AND TRADEMARK OFFICE
Certificate

Patent No. 7,151,328 B2                                          Patented: December 19, 2006

On petition requesting issuance of a certificate for correction of inventorship pursuant to 35 U.S.C. 256, it has been found that the above identified patent, through error and without any deceptive intent, improperly sets forth the inventorship.
   Accordingly, it is hereby certified that the correct inventorship of this patent is: Steven Bolz, Pfatter (DE); Günter Lugert, Regensburg (DE); and Gerhard Göser, Pentling, (DE).

Signed and Sealed this Sixth Day of November 2007.

MICHAEL J. SHERRY
*Supervisory Patent Examiner*
Art Unit 2836